United States Patent
Bryant

(10) Patent No.: US 8,179,957 B2
(45) Date of Patent: May 15, 2012

(54) QUADRATURE PULSE-WIDTH MODULATION METHODS AND APPARATUS

(75) Inventor: Carl Bryant, Höganas (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 981 days.

(21) Appl. No.: 12/135,326

(22) Filed: Jun. 9, 2008

(65) Prior Publication Data

US 2009/0149151 A1   Jun. 11, 2009

Related U.S. Application Data

(60) Provisional application No. 61/012,827, filed on Dec. 11, 2007.

(51) Int. Cl.
*H03K 7/08* (2006.01)
*H03K 9/08* (2006.01)

(52) U.S. Cl. ........ 375/238; 375/295; 375/296; 375/297; 375/298; 332/109

(58) Field of Classification Search ............. 375/237, 375/295–298, 238; 332/109
See application file for complete search history.

(56) References Cited

U.S. PATENT DOCUMENTS

| 4,178,557 | A | 12/1979 | Henry | |
|---|---|---|---|---|
| 7,260,368 | B1 | 8/2007 | Blumer | |
| 7,932,790 | B2 * | 4/2011 | Rexberg et al. | 332/109 |
| 2009/0021320 | A1 * | 1/2009 | De Jong et al. | 332/109 |
| 2009/0036064 | A1 * | 2/2009 | Ravi et al. | 455/76 |

FOREIGN PATENT DOCUMENTS

| GB | 977806 | 12/1964 |
|---|---|---|
| WO | 2007/083281 A1 | 7/2007 |
| WO | 2008/002225 A1 | 1/2008 |
| WO | 2008/051127 A1 | 5/2008 |
| WO | 2008/076021 A1 | 6/2008 |

OTHER PUBLICATIONS

UK Intellectual Property Office, Search and Examination Report in counterpart Application GB0822489.1, May 29, 2009.
Raab, F., "Radio Frequency Pulsewidth Modulation", IEEE Trans. Comm, pp. 958-966, Aug. 1973.
Zhang, X. et al., "Gain and Phase Error-Free LINC Transmitter", IEEE Transactions on Vehicular Technology, vol. 49, No. 5, Sep. 2000.
Bryant, Carl, "Pulse-Width Modulation at Radio Frequencies—Master of Science Thesis" University of Twente, Netherlands; Lund University, Sweden, Sep. 24, 2006.
Nielsen, M. et al., "An RF Pulse Width Modulator for Switch-Mode Power Amplification of Varying Envelope Signals", Aalborg University, Silicon Monolithic Integrated Circuits in RF Systems, 2007, pp. 277-280, 2007.

* cited by examiner

*Primary Examiner* — Phuong Phu
(74) *Attorney, Agent, or Firm* — Potomac Patent Group PLLC

(57) ABSTRACT

Switched-mode amplifiers and devices having such amplifiers include quadrature pulse-width modulation that is based on cartesian (as opposed to polar) coordinates. Two sets of pulses that represent respective in-phase and quadrature components of a conventional cartesian-coordinates input signal can be combined such that the combined set of pulses can be provided to a switched-mode amplifier without nonlinear cartesian-to-polar transformation and its associated wider internal bandwidth and other problems.

15 Claims, 10 Drawing Sheets

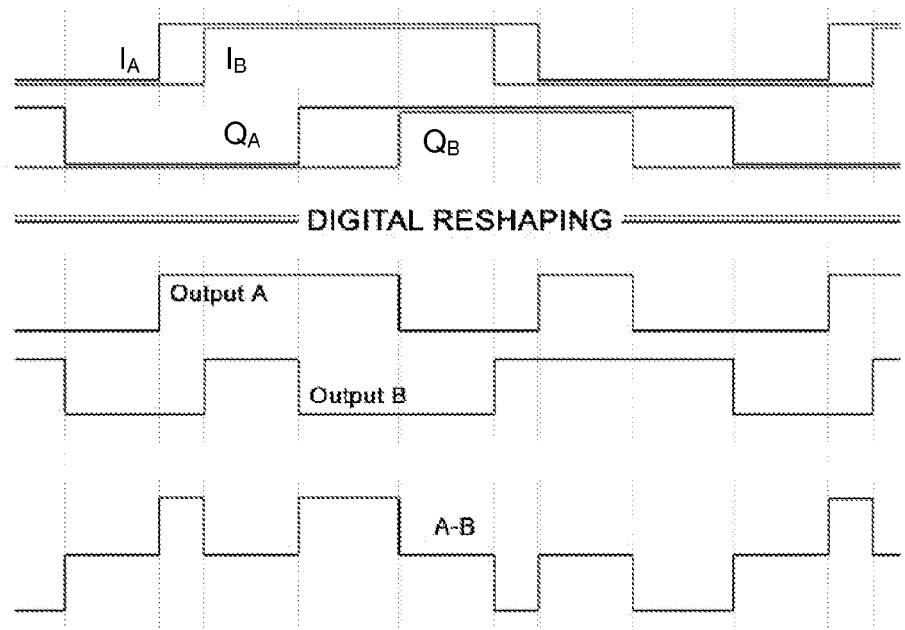
FIG. 7
FIG. 8A
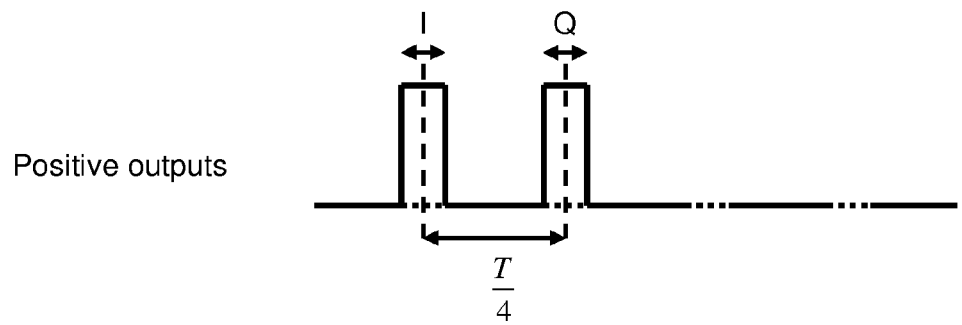
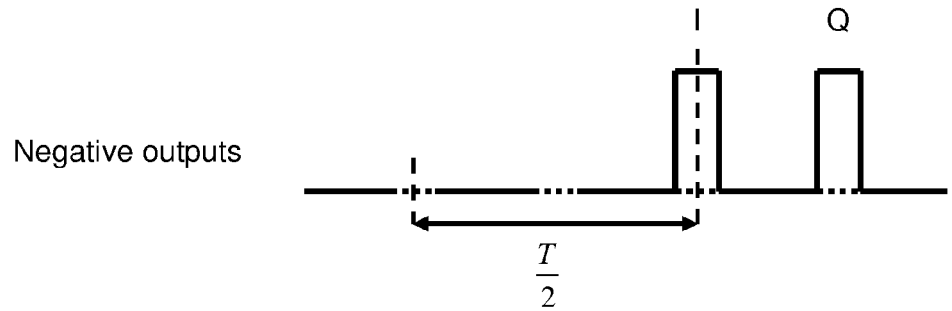
FIG. 8B

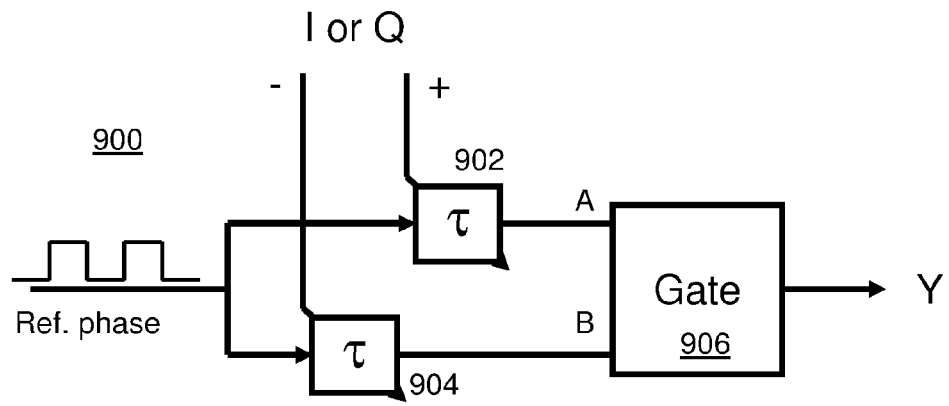
FIG. 9A
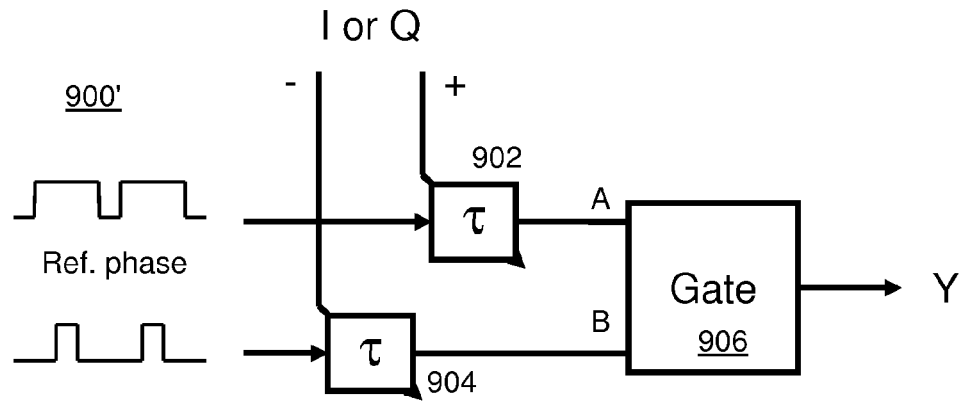
FIG. 9B
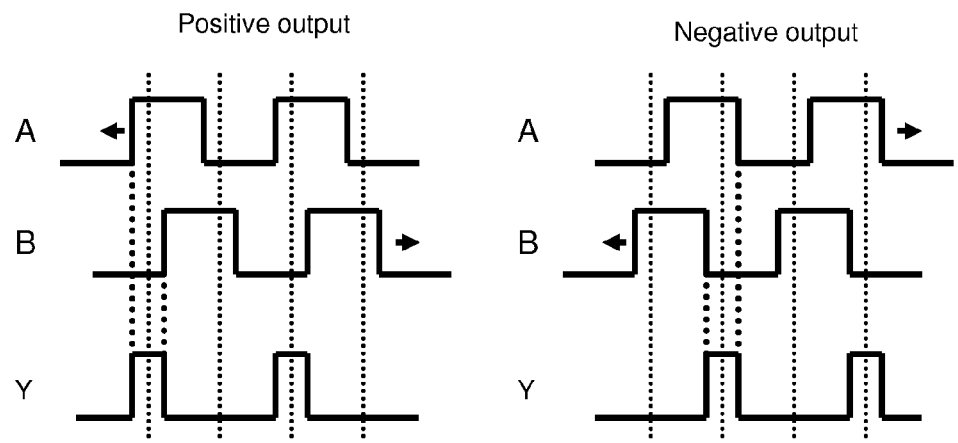
FIG. 10A
FIG. 10B

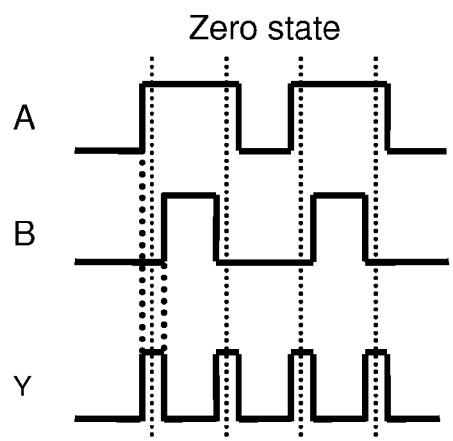
FIG. 10C
FIG. 11A
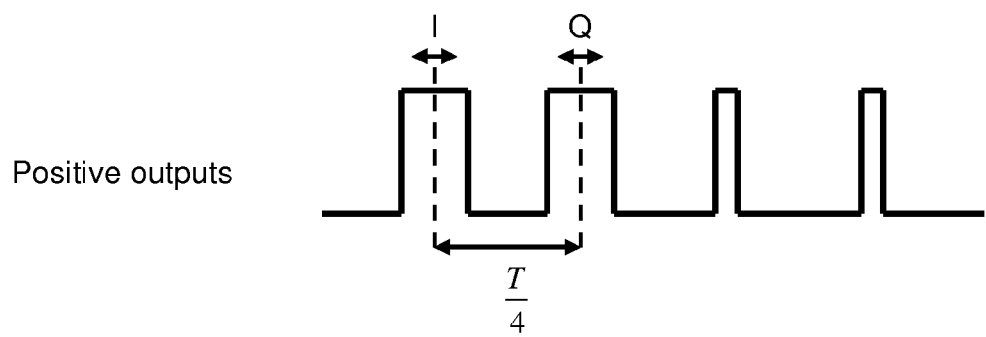
FIG. 11B
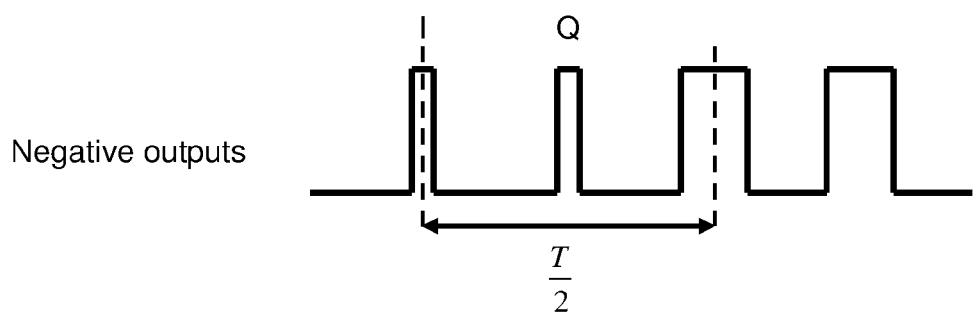

QUADRATURE PULSE-WIDTH MODULATION METHODS AND APPARATUS

This application is a non-provisional of and claims the benefit of the filing date of U.S. Provisional Patent Application No. 61/012,827 that was filed on Dec. 11, 2007.

BACKGROUND

This invention relates to electronic amplifiers, and more particularly to switched-mode radio frequency (RF) power amplifiers.

Transmitters in many modern communication systems, such as cellular radio systems having carrier frequencies of 1-2 gigahertz (GHz) or so, need to have wide bandwidth, wide dynamic range, and high accuracy (low distortion) in phase and envelope to deal with modern modulation schemes that enable effective use of allocated bandwidth. In addition, it is currently preferable that high-performance amplifiers be implemented in CMOS for reasons of cost and integration. Transmitters in battery-powered devices need to be efficient so that battery energy is conserved.

In conventional radio transmitters, the signal information is often represented as two channels in quadrature phase that can be mixed together to form a combined low-power signal that is amplified for transmission. A linear power amplifier is needed for proper amplification of the combined signal, but there is a trade-off between efficiency and linearity in RF power amplifiers. If high linearity is required, a Class A amplifier can be used, but at the cost of low efficiency. If a constant-envelope signal is to be amplified so that linearity is not critical, a high-efficiency switched-mode (Class D, E, or F) amplifier can be used. Switched-mode amplifiers also can provide high power with low peaks in current and voltage, behavior that is important in CMOS implementations due to the limited breakdown voltages of CMOS devices.

Various methods of designing high-efficiency amplifiers are known that require the input signal to be represented in polar coordinates (i.e., as an envelope, or amplitude, component and an associated phase component). It will be understood that polar coordinates are analogous to Cartesian coordinates, and polar modulation (envelope and phase) is analogous to quadrature modulation (in-phase component and quadrature-phase component). Polar modulation can be advantageous because typical active semiconductor devices, e.g., transistors, must operate nonlinearly if they are to operate with high power efficiency. In its nonlinear region, an active device can still represent the phase of an input signal with reasonable accuracy, but not the input signal's envelope. This behavior results in a natural separation of phase and envelope components that enables polar modulation systems to use highly non-linear but highly power-efficient switched-mode power amplifier architectures, such as Classes D, E, and F.

Converting a signal from Cartesian coordinates (in-phase and quadrature components) to polar coordinates (envelope and phase components) is a nonlinear transformation, and so an input signal, e.g., a signal to be amplified, that has a particular bandwidth before the nonlinear transformation will have a much wider bandwidth after the transformation. Modern communication systems usually allow for that by having an internal bandwidth that is four to eight times that of the original signal that needs to be handled in order not to introduce too much distortion. For example, a transmitter presented with an input signal having a bandwidth of 1 megahertz (MHz) usually has an internal bandwidth of at least 4-8 MHz if the input signal is converted from Cartesian to polar coordinates.

Wider internal bandwidths require, among other things, fast digital-to-analog (D/A) converters (assuming a digital input signal) that are harder to design and that dissipate more power. Another common problem with polar modulation is the difficulty of synchronizing the phase and envelope component signals, which is to say that it can be difficult to match the time delays of both component signal paths through the amplifier or transmitter.

In addition, to amplify an envelope component properly, a switched-mode amplifier typically needs some kind of linearization, such as pulse-width modulation (PWM), that itself can be linearized by using low-frequency feedback. PWM is described in U.S. patent application Ser. No. 12/127,126 filed on May 27, 2008, by C. Bryant for "Pulse-Width Modulator Methods and Apparatus", and linearization and feedback is described in M. Nielsen and T. Larsen, "An RF Pulse Width Modulator for Switch-Mode Power Amplification of Varying Envelope Signals", Aalborg University, Silicon Monolithic Integrated Circuits in RF Systems, 2007, pp. 277-280 (2007); and International Publication WO 2008/002225 A1 by H. Sjöland for "Switched Mode Power Amplification". An example of a high-efficiency amplifier that includes band-pass (BP) PWM is described in F. Raab, "Radio Frequency Pulsewidth Modulation", IEEE Trans. Comm. pp. 958-966 (August 1973). Instead of low-pass filtering the output signal to extract information at the same frequency as the input signal to an amplifier, Raab describes band-pass filtering in a transmitter to extract information around the PWM switching frequency.

Of course, it is desirable to avoid such complications and still have RF power amplifiers, transmitters, and other devices that meet the linearity and power-efficiency requirements of modern communication systems, such as recent- and future-generation cellular radio communication systems.

SUMMARY

In an aspect of this invention, there is provided a device for generating quadrature pulse-width modulation (QPWM) signals that includes a circuit configured to generate, based on an in-phase (I) component and a quadrature phase (Q) component of an input signal, at least two respective pulse-width modulated (PWM) signals that are trains of pulses; and a reshaper configured to transform the at least two PWM signals into a QPWM signal that is a succession of pulses in which alternating pulses have widths that correspond to one or the other of the I and Q components.

In an aspect of this invention, there is provided a method of generating QPWM signals that includes the steps of converting I and Q components of an input signal into at least two PWM signals that are trains of pulses, and reshaping the at least two PWM signals into a QPWM signal that is a succession of pulses in which alternating pulses have widths that correspond to one or the other of the I and Q components.

BRIEF DESCRIPTION OF THE DRAWINGS

The several features, objects, and advantages of this invention will be understood by reading this description in conjunction with the drawings, in which:

FIG. 7 shows waveforms depicting the operation of a reshaper in the modulator of FIGS. 4A, 4B;

FIGS. 8A, 8B depict phase-shifted pulses;

FIGS. 9A, 9B show exemplary modulators for generating phase-shifted pulses;

FIGS. 10A, 10B, 10C show timing diagrams for a gate in the modulator of FIG. 9;

FIGS. 11A, 11B depict quadrature pulse-width modulation signals;

DETAILED DESCRIPTION

As described in more detail below, switched-mode amplifiers and devices having such amplifiers include PWM in a way that is based on Cartesian (as opposed to polar) coordinates. The inventor has recognized that two sets of pulses that represent respective in-phase and quadrature components of a conventional cartesian-coordinates input signal can be combined such that the combined set of pulses can be provided to a switched-mode amplifier without nonlinear cartesian-to-polar transformation and its associated wider internal bandwidth and other problems. In this application, the combined pulse trains are called a quadrature pulse-width modulation (QPWM) signal, and as will be clear from the context, such a signal is produced by a device called a quadrature pulse-width modulator (QPWM).

Figure 1:
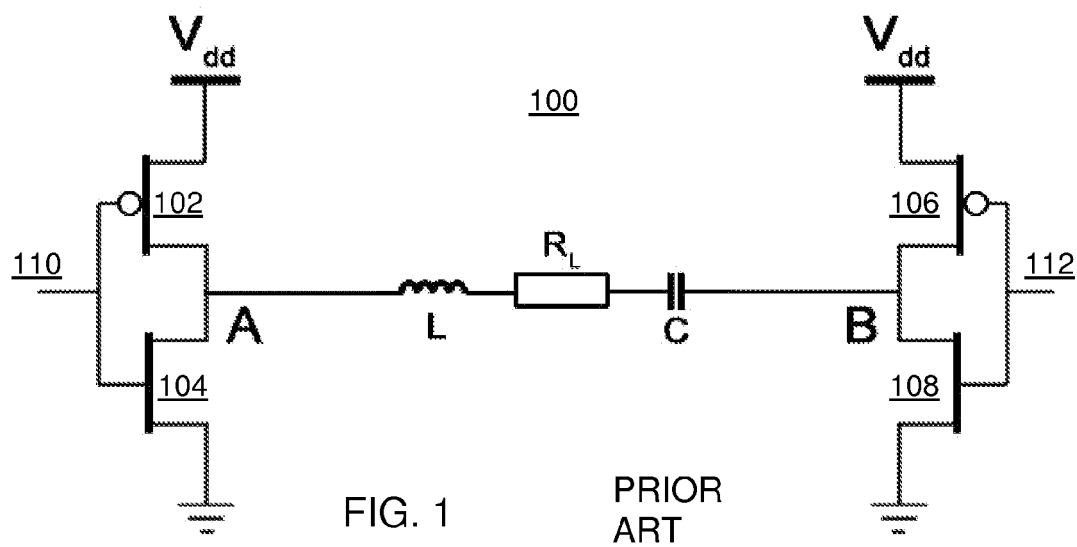
FIG. 1 is a circuit diagram of a switched-mode amplifier.

FIG. 1 depicts a generalized Class D amplifier 100 that has two stages A, B, each of which is comprised of two transistors 102, 104 and 106, 108. As shown in FIG. 1, the transistors are connected between a single voltage supply $V_{dd}$ and ground. A differential input signal is provided to the terminals 110, 112, and a differential output signal is formed across a resonant load, which typically includes a resistance $R_L$ and some frequency-dependent inductance L and capacitance C.

Figure 2A:
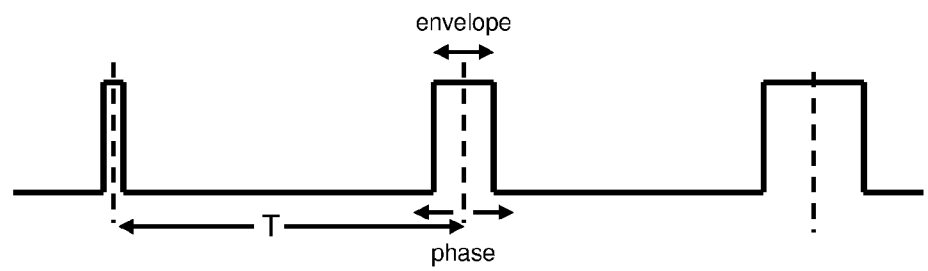
FIGS. 2A, 2B depict monopolar and bipolar pulse-width modulation signals.
Figure 2B:
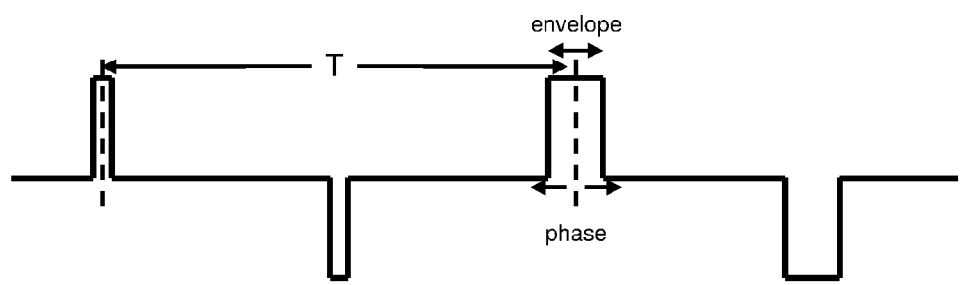

With BP PWM, the inputs 110, 112 to the stages A, B are driven by pulse trains such as those depicted in FIGS. 2A, 2B. FIG. 2A depicts a BP PWM signal that is called "monopolar" and FIG. 2B depicts a BP PWM signal that is called "bipolar" in the publication by Raab cited above. The pulse trains have a pulse repetition period T, and the widths of the pulses, three of which are shown in FIG. 2A and four of which are shown in FIG. 2B, determine the envelope of the output signal delivered to the load $R_L$. The positions of the pulses along the horizontal (time) axis determine the phase of the output signal. The vertical axes in the figures correspond to amplitude, which in FIG. 2B ranges between negative and positive. A monopolar PWM signal can be used in a single-ended amplifier, and as depicted in FIG. 2A, the duty cycle (and hence the envelope) is increasing. As depicted in FIG. 2B, the duty cycle of the bipolar PWM signal (and hence the envelope) is also increasing. In the case of a monopolar PWM signal and a differential output as in the amplifier of FIG. 1, the signal provided to the inputs 110, 112 would be balanced (i.e., the inputs would be mirror images).

The inventor has recognized that a switched-mode amplifier such as that depicted in FIG. 1 can be linearized by QPWM, which is to say by PWM that is based on Cartesian (as opposed to polar) coordinates. With such an improved amplifier, an input signal can be provided in the form of in-phase and quadrature components and need not be transformed into envelope and phase components.

Figure 3A:
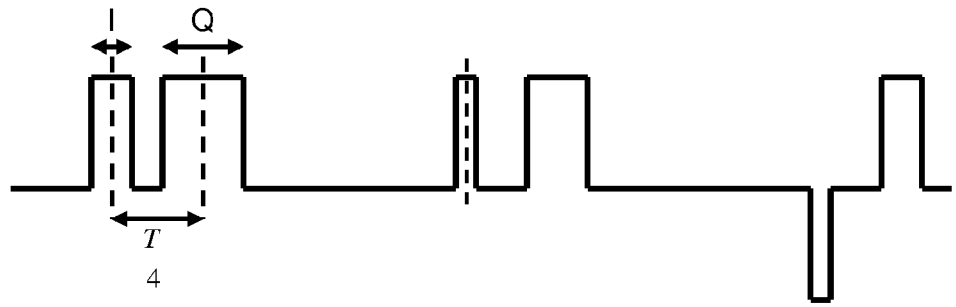
FIGS. 3A, 3B depict monopolar and bipolar quadrature pulse-width modulation signals.
Figure 3B:
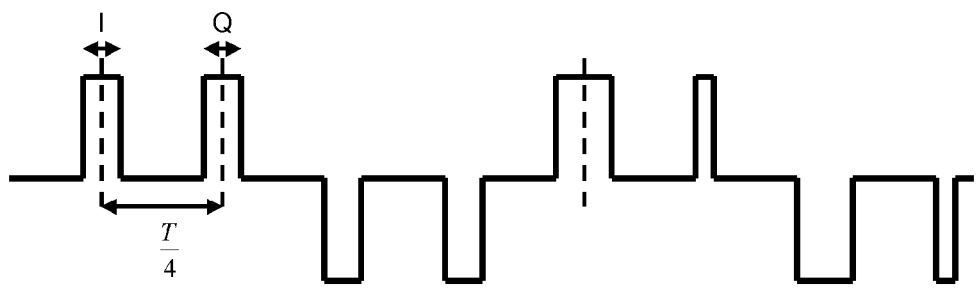

FIG. 3A depicts a QPWM signal having an I component that starts at a small positive value (at the left-hand side of the figure) and then decreases and goes negative (at the right-hand side of the figure), and a Q component that starts at a large positive value and then decreases but stays positive. FIG. 3B depicts a bipolar QPWM signal having I and Q components that start out the same, and then the I component increases for the next period and the Q component decreases. In FIG. 3B, neither of the I, Q components goes negative, which would result in the associated pulses altering direction.

Although FIGS. 2 and 3 show unrelated signals, it can be seen in general that polar-coordinates pulses, like those in FIG. 2, are transformed into respective sets of two cartesian-coordinates pulses, like those in FIG. 3. The pulses in each set respectively represent the in-phase component I and the quadrature component Q, and the widths of the pulses in each set determine the values of the I and Q components. It will be understood that a monopolar signal like that in FIG. 2A has only positive amplitudes by definition. When such a monopolar signal is adapted to operate in quadrature, the result is not really monopolar anymore as it is necessary to handle negative signals, e.g., with a differential output or with a phase shift as described below. If this is done, then the results are again a monopolar signal, which enables the use of a single-ended, single-supply output.

Moreover, the signals depicted in FIGS. 3A, 3B can be seen as combinations of two pulse trains that are separated by a quarter of their periods T. In other words, a QPWM signal comprises two pulse trains that are in quadrature, and the two pulse trains can respectively represent an in-phase component and a quadrature component of a signal. As explained below, the QPWM signal can be provided to a switched-mode amplifier such as that depicted in FIG. 1, thereby enabling the amplifier to handle a cartesian-coordinates signal without a nonlinear cartesian-to-polar transformation.

Thus, Cartesian coordinates can be used with band-pass (BP) PWM by overlaying pulse trains based respectively on the I- and Q-components of an input signal. The overlaid pulse trains are offset from each other by a fourth of the pulse repetition period (i.e., by ninety degrees). Since the I and Q information typically can be bipolar, i.e., it can have positive or negative values, a QPWM modulator is preferably able to handle negative signals, but a 180-degree shift in phase can be used instead as described below. It is currently believed that using a 180-degree phase shift instead of bipolar signals may affect benefits provided by QPWM because such a phase shift can be viewed as a local transformation of the I and Q components to polar coordinates. Although the phase shift could be performed quickly, it could be difficult to handle resulting discontinuities in the amplitudes of the I and Q components if the conversion is performed outside the modulator. Such effects on the benefits of QPWM might be avoided by generating the phase shift in the modulator rather than in the baseband input signal.

Figure 4A:
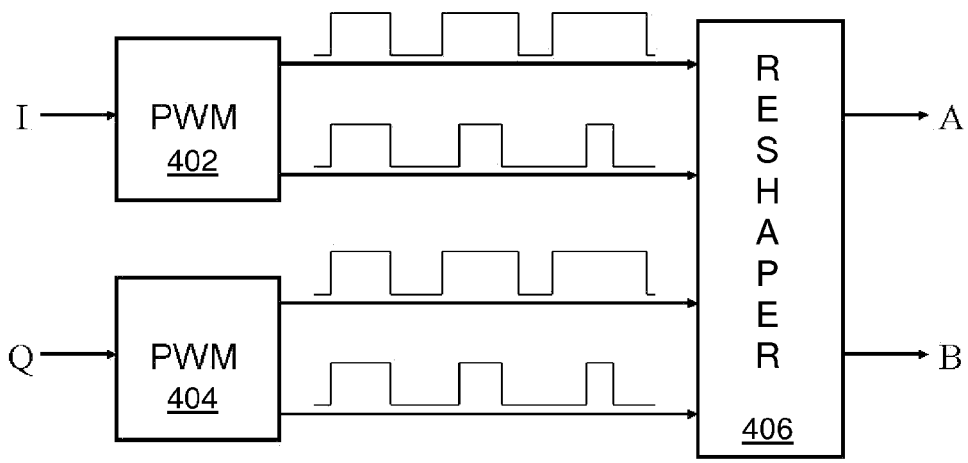
FIG. 4A depicts a quadrature pulse-width modulator.

FIG. 4A depicts a device 400 for generating a QPWM signal such as those depicted in FIGS. 3A, 3B. Cartesian-coordinates components 1, Q of an input signal, such as an input signal to be amplified by a switched-mode amplifier 100, are provided to respective pulse-width modulators (PWM) 402, 404. In the exemplary arrangement depicted in FIG. 4A, each PWM 402, 404 can produce a differential output signal that can be obtained by taking the difference between the two output signals shown. The PWM signals produced by the PWMs 402, 404 are provided to a digital reshaper 406 that transforms the PWM signals into QPWM signals A, B that jointly represent the differential signal that contains I- and Q-component information.

The PWMs 402, 404 can be realized in any of a number of different ways as known in the art. For example, a PWM can include an integrator and a comparator configured such that the integrator generates a (phase-modulated) triangular wave at a desired frequency based on an input square wave, and the comparator compares the triangular wave to the PWM input signal, e.g., a baseband I or Q component; the signal generated by the comparator is the PWM output signal that is based on the PWM input signal, which represents I- or Q-component amplitude.

For another example, a PWM 402, 404 can include two controllable time-delay elements and a logical AND gate. The time-delay elements are configured such that their time delays have opposite characteristics, i.e., one time delay increases by the same amount that the other time delay decreases for a change in a control signal, i.e., the PWM input signal that represents I- or Q-component amplitude. The two time-delayed signals generated by the time-delay elements are provided as inputs to the logical AND gate, and the output of the logical AND gate is the PWM output signal. The phase information is represented by the amplitudes of the I and Q components. Such an arrangement currently seems preferable to an integrator-comparator arrangement because of its lesser demands on gain and slew rate at the operating frequency, although sufficient time-delay linearity is needed to avoid unwanted modulation (amplitude/amplitude and amplitude/phase).

Figure 4B:
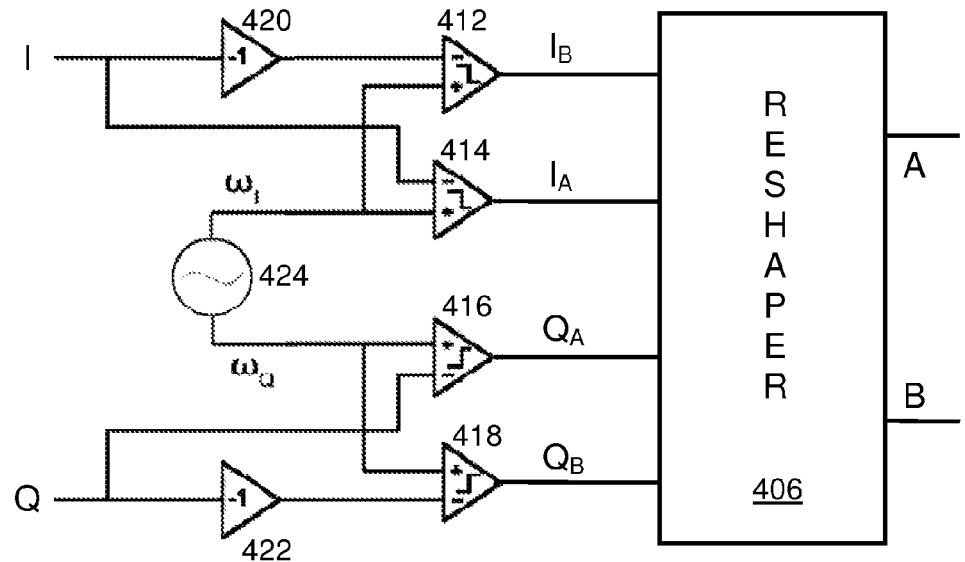
FIG. 4B depicts the quadrature pulse-width modulator in more detail.

FIG. 4B depicts the QPWM 400 in more detail, showing exemplary arrangements of the PWMs 402, 404. The PWMs 402, 404 include respective pairs of comparators 412, 414 and 416, 418 and respective inverters 420, 422. The comparators 412, 414 and inverter 420 are configured such that they generate a pair of output signals $I_A$, $I_B$ based on an input in-phase component signal I and a signal $\omega_I$ generated by an oscillator 424. In substantially the same way, the comparators 416, 418 and inverter 422 are configured such that they generate a pair of output signals $Q_A$, $Q_B$ based on an input quadrature-phase component signal Q and a signal $\omega_Q$ generated by the oscillator 424 that is phase-offset by ninety degrees with respect to the signal $\omega_I$. The inverters 420, 422 enable generation of complimentary I- and Q-components signals. In an RF transmitter that includes a switched-mode amplifier for QPWM signal generated by the QPWM 400, the signals generated by the oscillator 424 would typically have the frequency of the desired carrier signal. The phase reference signals $\omega_I$ and $\omega_Q$ provided by the generator 424 can be sinusoidal, triangular, square, etc. as appropriate to the other components of the PWMs 402, 404.

Figure 5A:
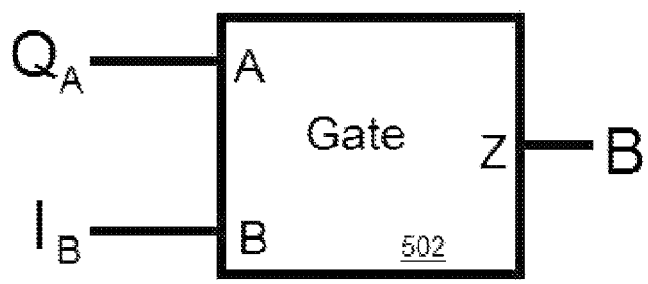
FIGS. 5A, 5B are diagrams of reshapers for the modulator of FIGS. 4A, 4B.
Figure 5A:
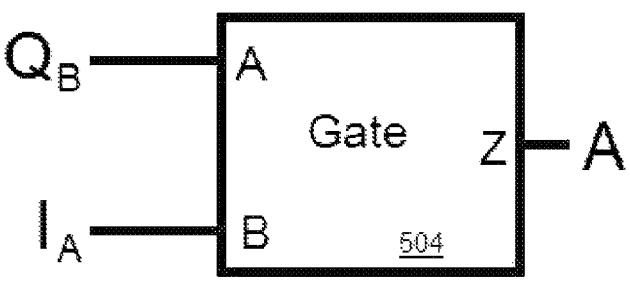

The PWM pulse-train signals $I_A$, $I_B$ and $Q_A$, $Q_B$ generated by the PWMs 402, 404 are transformed to QPWM signals by the reshaper 406, which can be realized by a suitably configured arrangement of logic gates such as that depicted in FIG. 5 or by a suitably programmed electronic processor, provided the processor operates fast enough to obtain sufficient resolution, e.g., on the order of 100 times the carrier frequency.

FIG. 5A is a diagram of a reshaper 406 that can generate a QPWM signal such as that depicted in FIG. 3A. Two gates 502, 504 receive the signals $I_A$, $I_B$, $Q_A$, $Q_B$ that are produced by the PWMs 402, 404 and input to the reshaper 406, with each gate 502, 504 receiving respective pairs of the input signals. The outputs Z of the gates 502, 504 are the signals B, A generated by the reshaper 406. The truth table for the gates 502, 504 is as follows:

| A | B | Z |
|---|---|---|
| 0 | 0 | 0 |
| 0 | 1 | 1 |
| 1 | 1 | 0 |
| 1 | 0 | 0 |

The gates 502, 504 can be implemented conveniently as suitably connected collections of conventional digital logic gates or suitably programmed gate arrays and processors.

Figure 5B:
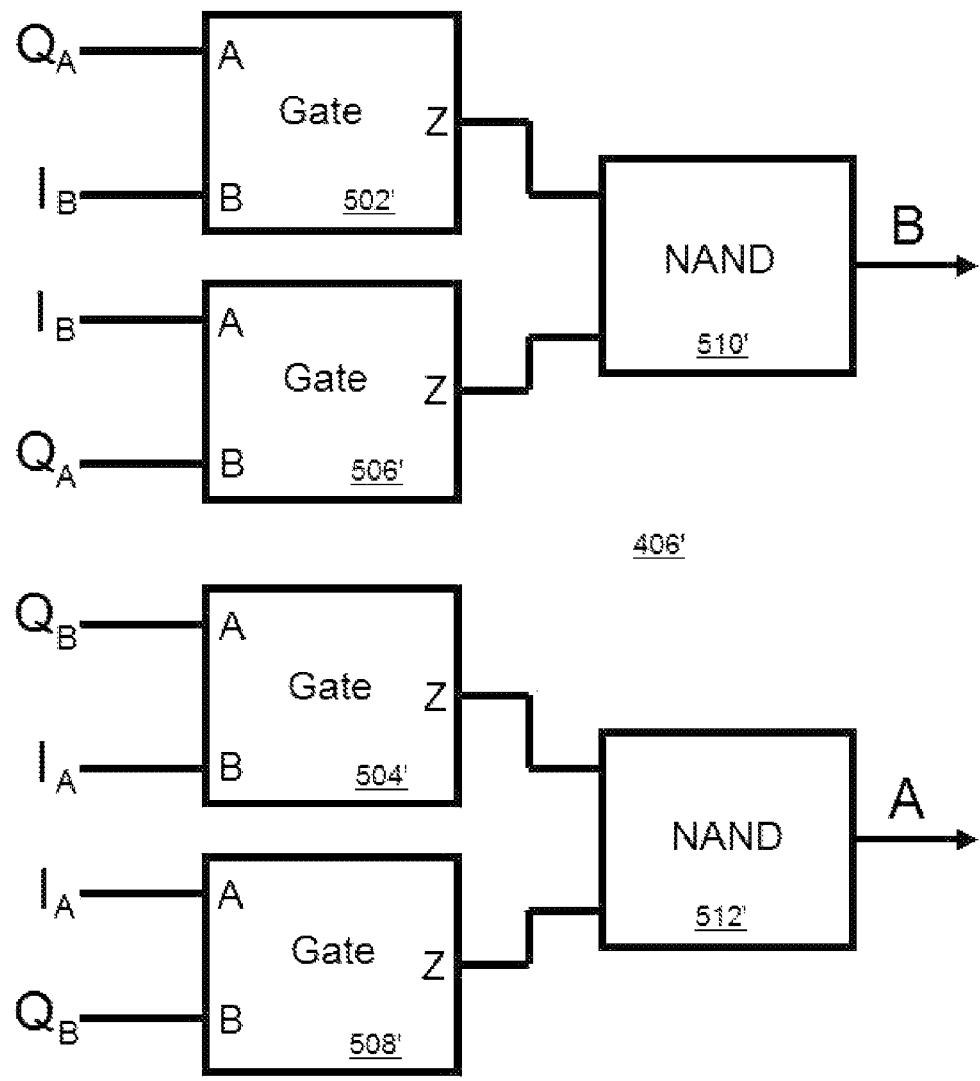

FIG. 5B is a diagram of a reshaper 406' that can generate a bipolar QPWM signal such as that depicted in FIG. 3B. Two pairs of two gates 502', 506' and 504', 508' receive the signals $I_A$, $I_B$, $Q_A$, $Q_B$ that are produced by the PWMs 402, 404 and input to the reshaper 406', with the gates in each pair receiving respective pairs of the input signals. The outputs Z of each pair of gates 502', 506' and 504', 508' are provided to respective NAND gates 510', 512' that produce the signals B, A generated by the reshaper 406'. The truth table for each gate 502'-508' is as follows:

| A | B | Z |
|---|---|---|
| 0 | 0 | 1 |
| 0 | 1 | 0 |
| 1 | 1 | 1 |
| 1 | 0 | 1 |

The gates 502'-508' can be implemented conveniently as suitably connected collections of conventional digital logic gates or suitably programmed gate arrays and processors. It will be noted that the gates 502, 504 and the gates 502'-508' have different truth tables, although the difference is merely an inverted output. The gates 502', 504' can be used in the reshaper 406 by including a simple inverter at each gate output.

The artisan will understand that the pairs of I and Q signals input to the gates 502'-508' are pulse-width modulated I and Q components of the signals output by the PWMs 402, 404, and that the A and B signals output by the gates 510', 512' are the positive and negative parts of a differential QPWM signal. Of course, the input I- and Q-components can be independent of each other.

An advantage of the QPWM 400 depicted in FIGS. 4A, 4B is that more complicated QPWM signals are "built" from less complicated PWM signals, although with BP PWM, it is important to recall that the envelope does not have a linear relationship to the duty cycle of the output due to the non-linearity of the sinusoidal function. Modulators of this type can be linearized using low-pass feedback, as described in M. Nielsen and T. Larsen, "An RF Pulse Width Modulator for Switch-Mode Power Amplification of Varying Envelope Signals", Aalborg University, Silicon Monolithic Integrated Circuits in RF Systems, 2007, pp. 277-280; and WO 2008/002225 A1 cited above.

Figure 6:
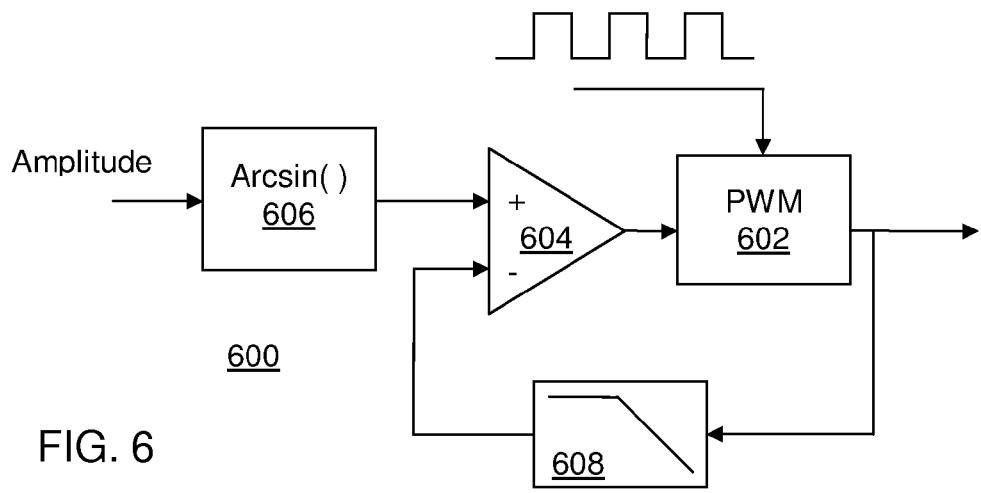
FIG. 6 depicts a linearized pulse-width modulator.

FIG. 6 depicts an exemplary arrangement of a pulse-width modulator 600 that is linearized with low-pass feedback and that includes predistortion of the input signal. The modulator 600 includes a PWM device 602 that receives a reference signal, such as a square wave, and an input signal that is generated by a differential amplifier 604. The PWM device 602 can be any of the PWM devices described above, such as a comparator. The amplifier 604 generates the input signal by forming the difference between the arcsine of an input amplitude signal and the low-pass-filtered output signal of the PWM device 602. The arcsine of the input amplitude signal, such as one of the I- and Q-components input to the PWMs 402, 404, is formed by a suitable arcsine generator 606, and the low-pass-filtered output signal of the PWM device 602 is formed by a suitable low-pass filter 608.

The duty cycle and envelope in the signal produced by the PWM device 602 have a non-linear (i.e., sinusoidal) relationship inherent to BP PWM, although for a small input amplitude signal, a sinusoid is approximately linear. Low-pass feedback as depicted in FIG. 6 effectively linearizes the duty cycle, and thus enables indirect control of the envelope. In other words, suitable low-pass feedback produces a sinusoidal relationship between the input and output amplitude signals. Such non-linearity can be compensated by input signal predistortion of a suitable form, which in this exemplary arrangement is provided by the arcsine generator 606 that can be a suitably programmed processor or even just a look-up table of arcsine values that are retrieved based on the input signal. The artisan will appreciate that suitable predistortion can be provided in many different ways. A linear envelope detector could be used to measure the envelope and so avoid predistortion, although the time delay introduced by an accurate envelope detector would make it more difficult to achieve a high loop bandwidth. An envelope detector could also be used to calibrate a predistorter.

FIG. 7 shows waveforms illustrating the operation of the reshaper 406'. It will be observed that the edges of the input signals $I_A$, $I_B$, $Q_A$, $Q_B$ to the reshaper, i.e., at the outputs of the PWMs 402, 404, position the edges of the reshaper's output signals A, B. In the example shown, the QPWM's differential output signal, i.e., the difference of the two outputs A, B, is a tri-state signal.

The QPWM 400 described above employs bipolar signals (e.g., it can generate a bipolar differential output A-B). For applications that require a single-ended output (e.g., when only a single power supply voltage is used or otherwise when only a single-polarity output can be handled), it is possible to handle pulse polarity changes by transforming them into 180-degree phase shifts. This is depicted in FIGS. 8A, 8B, which show that the associated pulses change positions by half of the period T (i.e., by 180 degrees) as the respective I or Q component input to the PWMs 402, 404 becomes negative.

FIG. 9A shows an exemplary modulator 900 for generating phase-shifted pulses such as those depicted in FIGS. 8A, 8B. The modulator 900 includes a pair of controllable time-delay elements 902, 904 and a logical gate 906. Based on a control signal, such as either an I- or Q-component of an input signal, the elements 902, 904 delay (i.e., phase-shift) a reference wave, such as a square wave, having a reference phase and duty cycle in opposite temporal directions. The phase-shifted reference waves generated by the elements 902, 904 are converted by the gate 906 into pulses corresponding to the input control signal. The truth table of the gate 906 is as follows:

| A | B | Y |
|---|---|---|
| 0 | 0 | 0 |
| 0 | 1 | 0 |
| 1 | 1 | 0 |
| 1 | 0 | 1 |

The gate 906 can be implemented by a suitably configured arrangement of otherwise conventional logic gates or gate array or by a suitably programmed electronic processor.

The operation of the modulator 900 and gate 906 is depicted by the timing diagrams shown in FIGS. 10A, 10B, which illustrate two periods. As seen in FIG. 10A, the gate output Y corresponds to positive-polarity pulses such as those depicted in FIGS. 2, 3, and 7 when the rising edge of the input A square wave occurs before the rising edge of the input B square wave. As seen in FIG. 10B, the gate output Y corresponds to negative-polarity pulses such as those depicted in FIGS. 2, 3, and 7 when the falling edge of the input B square-wave occurs before the falling edge of the input A square-wave. The horizontal arrows in FIGS. 10A, 10B indicate that the temporal positions of the reference waves (i.e., the phase) change in response to the differential control signal provided to the delay elements 902, 904.

Rather than a modulator 900, another way to handle bipolar signals is to supply pulses at both 0 degrees and 180 degrees simultaneously to a suitable arrangement of logic gates or a suitably programmed processor. For example, the modulator 900 can be adapted by supplying the two time-delay elements 902, 904 with respective rectangular waves having different duty cycles, the rectangular wave supplied to the delay element 902 having wider pulses than that supplied to the delay element 904.

Such an adapted modulator 900' is depicted in FIG. 9B. Just as the modulator 900, the modulator 900' includes controllable time-delay elements 902, 904 and logical gate 906, with the delay elements receiving different reference pulse signals as just discussed. For an output of zero, all reference pulses have the same width, and so cancel each other at the operating frequency (i.e., 1/T). To output a non-zero signal, one pulse increases in width and the corresponding pulse at 180-degrees relative phase decreases in width, as depicted in FIG. 11. As the signal amplitude grows, one set of pulses may disappear, although there is an interval during which positive and negative pulses overlap. Higher-order harmonics at multiples of the operating frequency can be removed by suitable filtering.

The artisan may note a similarity of the modes of operation of the modulators 900, 900' to amplifier modes of operation. The modulator 900 is reminiscent of a Class B amplifier in that positive and negative pulses do not overlap, and the modulator 900' is reminiscent of a Class AB amplifier in that the crossover is evened out by permitting an overlap. FIG. 10C is a timing diagram that shows the zero-input state of the modulator 900', from which it can be seen that the square waves having different duty cycles do not exactly cancel. FIG. 10C also depicts two periods.

Figure 12:
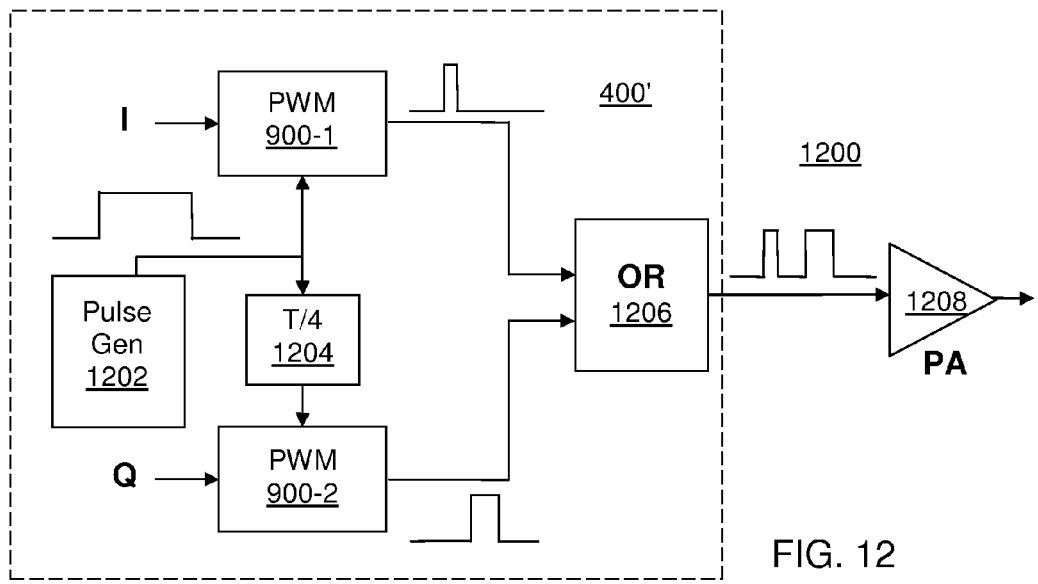
FIG. 12 depicts an arrangement that includes another embodiment of a quadrature pulse-width modulator.

Two modulators 900 or 900' can be used to generate the pulses for the I and Q components, respectively, in a QPWM. FIG. 12 depicts an arrangement 1200 that includes such a QPWM 400' having two modulators 900-1, 900-2, a reference pulse generator 1202, a quarter-wave phase shifter 1204, and a logical OR gate 1206. The shifter 1204 effectively adjusts the two modulators 900-1, 900-2 such that they are 90-degrees apart by adjusting the relative phase of the reference pulses input to the modulators.

The two sets of pulses produced by the modulators 900-1, 900-2 from input I- and Q-component signals, respectively, are combined by the OR gate 1206, or another suitable device, to form a QPWM signal that corresponds to a combination of the I and Q components. Thus, it can be seen that the gate 1206 is a reshaper, like the reshapers 406, 406'. In the arrangement 1200 depicted in FIG. 12, the QPWM signal is amplified by an amplifier 1208, the output of which may be passed to an antenna or other devices.

It will be appreciated that a modulator 900 or 900' does not generate a differential output signal by itself, and so a pair of modulators 900 or 900', a respective one for each of positive and negative output signals, can be used to generate a differential signal and act as the PWM 402 or the PWM 404 described above.

Figure 13B:
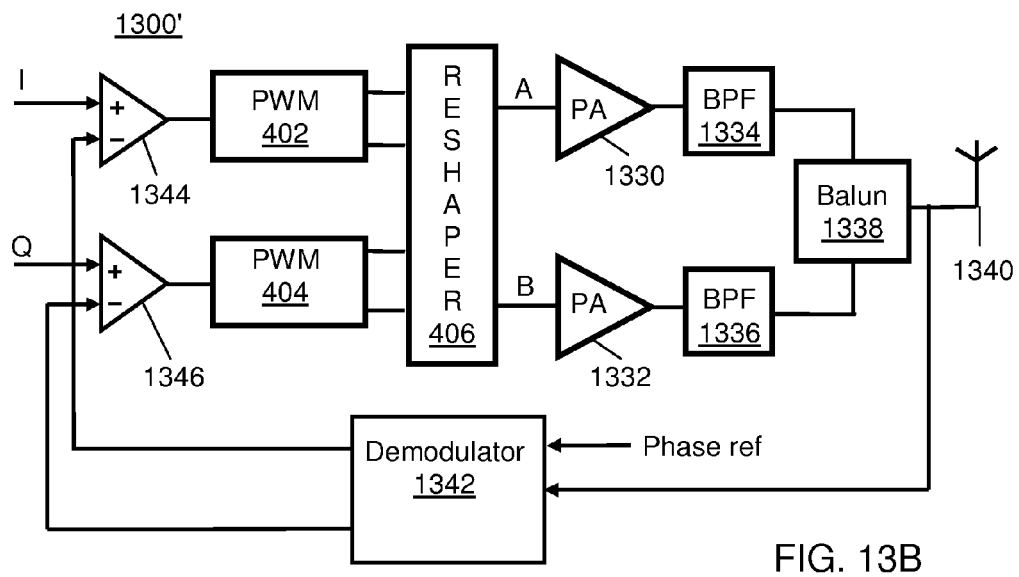
FIGS. 13A, 13B depict transmitters having quadrature pulse-width modulation.
Figure 13A:
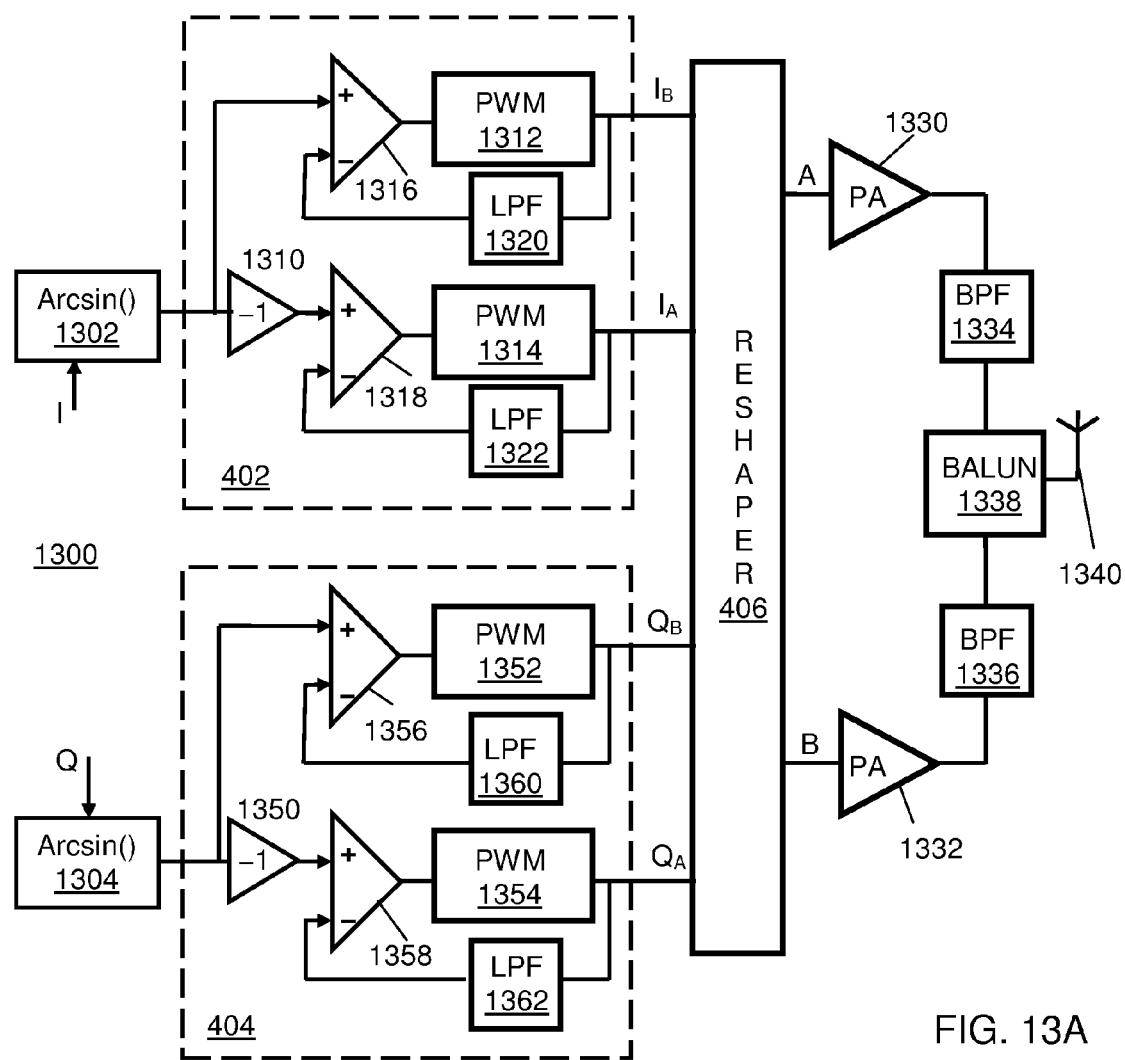

FIG. 13A is a block diagram of a portion of an improved transmitter 1300 that includes predistorted and linearized QPWM as described above. In-phase I and quadrature Q components of a signal to be amplified or transmitted are provided to respective arcsine generators 1302, 1304 that "predistort" the input I and Q components as described above. The arcsines produced by the generators 1302, 1304, which is to say predistorted I and Q components, are provided to respective PWMs 402, 404 that are linearized by low-pass filters (LPFs) and the predistortion. It will be recognized that the arrangement depicted in FIG. 13A is in effect a combination of the arrangements depicted in FIGS. 4B and 6. It will also be recognized that modulators 900, 900' can be used in the improved transmitter 1300 with suitable adaptation of the arrangement as described above.

As depicted in FIG. 13A, the PWMs 402, 404 include respective inverters 1310, 1350; respective pairs of PWMs 1312, 1314 and 1352, 1354, which may be comparators; respective pairs of differential amplifiers 1316, 1318 and 1356, 1358; and respective pairs of low-pass filters (LPFs) 1320, 1322 and 1360, 1362. The PWMs 402, 404 generate respective pairs of output PWM pulse-train signals $I_A$, $I_B$ and $Q_A$, $Q_B$ based on the I- and Q-component signals and suitable reference signals (not shown in FIG. 13A for clarity). As described above, the reference signals applied to the PWMs 1352, 1354 are phase-offset by ninety degrees with respect to the reference signals applied to the PWMs 1312, 1314. The inverters 1310, 1350 enable generation of complimentary I- and Q-component signals. The amplifiers 1316, 1318 and 1356, 1358 generate the input signals for their respective PWMs by forming the difference between inputs to the amplifiers and the low-pass-filtered output signals of the PWMs.

The PWM pulse-train signals $I_A$, $I_B$ and $Q_A$, $Q_B$ generated by the PWMs 402, 404 are transformed to QPWM signals A, B by the reshaper 406, which can be realized by a suitably configured arrangement of logic gates such as those depicted in FIG. 5 or by a suitably programmed electronic processor as described above. The QPWM signals A, B generated by the reshaper 406 are provided to respective power amplifiers 1330, 1332, and the amplified signals generated by the amplifiers are spectrally shaped by respective bandpass filters (BPFs) 1334, 1336. The filtered signals produced by the BPFs are combined by a balun 1338, which also impedance-matches the BPFs to an antenna 1340.

FIG. 13B is a block diagram of a portion of a transmitter 1300' that includes QPWM with global feedback. As in the transmitter 1300, the transmitter 1300' receives I and Q components of a signal to be transmitted, and includes respective PWMs 402, 404 for signals based on the I, Q components that generate respective pairs of output PWM pulse-train signals $I_A$, $I_B$ and $Q_A$, $Q_B$ based on the signals based on the I- and Q-component signals and suitable reference signals (not shown in FIG. 13B for clarity). As described above, the PWMs 402, 404 are phase-offset by ninety degrees with respect to each other. The PWM pulse-train signals $I_A$, $I_B$ and $Q_A$, $Q_B$ generated by the PWMs 402, 404 are transformed to QPWM signals A, B by the reshaper 406 as described above, and the QPWM signals A, B are provided to respective power amplifiers 1330, 1332. The amplified signals generated by the amplifiers are spectrally shaped by respective bandpass filters 1334, 1336, and the filtered signals produced by the BPFs are combined by the balun 1338, which also impedance-matches the BPFs to the antenna 1340.

Global feedback in the transmitter 1300' is provided by a demodulator 1342, which receives a portion of the combined signal generated by the balun 1338 and demodulates that portion into demodulated I- and Q-component signals that are respectively combined with the input I and Q components by differential amplifiers 1344, 1346. For the transmitter 1300' to have wide bandwidth and avoid instability, it is currently believed that the phase reference provided to the demodulator 1342 should be compensated sufficiently for the propagation delay through the transmitter (and demodulator). The input I and Q components may also be predistorted if desired, just as in almost any transmitter, but in general such predistortion would be different from the arcsine described above.

It is currently believed that use of an envelope detector to avoid predistortion would not be useful in the transmitter 1300'. Placing such a detector after the balun 1338 would result in detection of the envelope of the combined signal, and would thus be part of a polar representation. Such a detector could not be placed before the balun 1338 because in the transmitter 1300', each of the QPWM signals A, B is based on both I and Q components.

Figure 14:
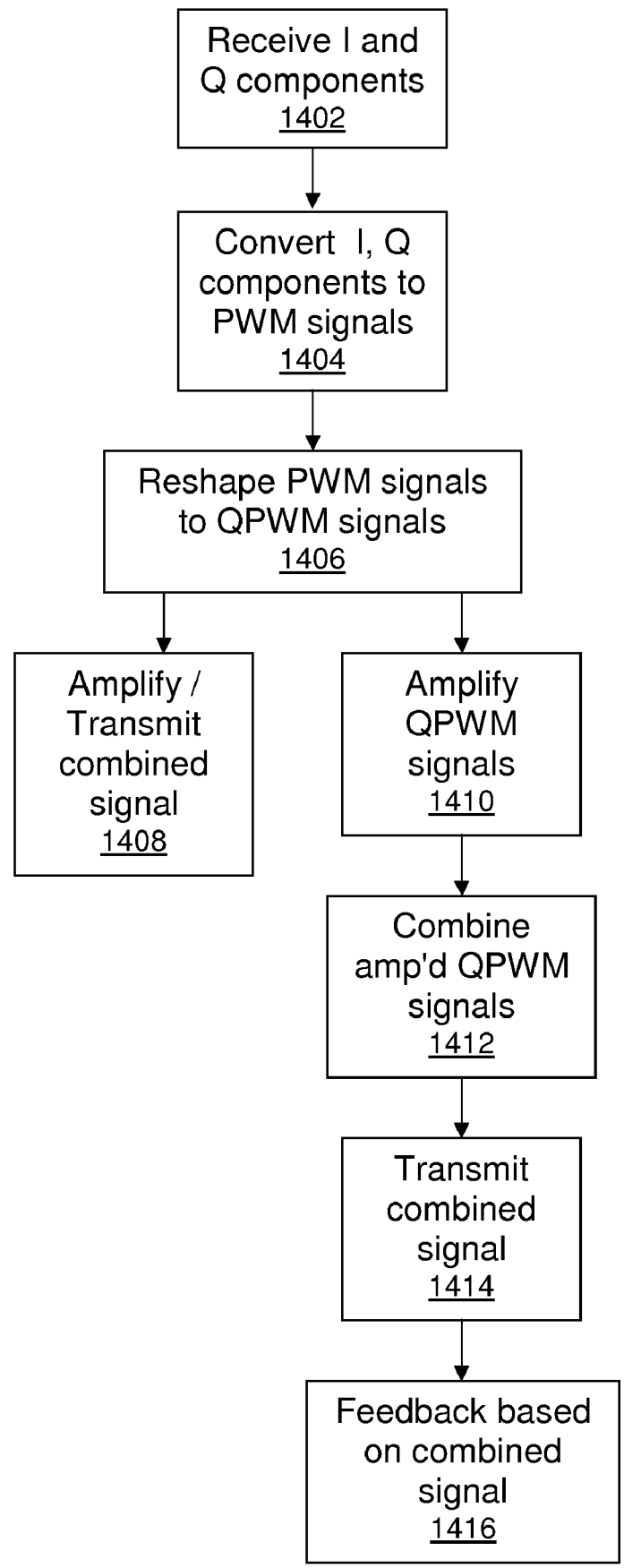
FIG. 14 is a flow chart of a method of quadrature pulse-width modulation.

A method of quadrature pulse-width modulation such as that depicted by the flow chart in FIG. 14 can now be appreciated. In step 1402, in-phase and quadrature components of an input signal are received, and in step 1404, the component signals are converted into respective pulse-train (PWM) signals. Such PWM signals can be the $I_A$, $I_B$ and $Q_A$, $Q_B$ signals generated by the PWMs 402, 404, 900-1, 900-2 and the signal Y generated by the modulators 900, 900' discussed above. In step 1406, the PWM signals are reshaped into output QPWM signals, which can be the signals A, B generated by the reshapers 406, 1206. The QPWM signals are successions of pulses in which alternating pulses have widths that correspond to one or the other of the I and Q components.

As described above in connection with FIGS. 6 and 13 for example, the step of converting the I, Q components to respective PWM signals can include linearizing the PWM signals, with or without predistortion, by adding fed-back portions of the PWM signals to the I, Q components to be converted. The steps in FIG. 14 can be performed by one or more suitably programmed electronic processors or suitably connected collections of logic gates and other circuits.

It will be understood that the method depicted in FIG. 14 can be augmented in many ways. For example, the QPWM signals can be amplified and/or transmitted (step 1408), as described above in connection with FIG. 12. As an alternative, the QPWM signals can be amplified separately (step 1410), the amplified QPWM signals can be combined (step 1412), and the combined signal can be transmitted or otherwise handled (step 1414), as described above in connection with FIG. 13B. The method can then be linearized by adding feedback signals based on the combined signal to the I, Q components (step 1416).

By avoiding a conversion from Cartesian to polar coordinates, the internal bandwidths of devices employing switched-mode amplifiers with QPWM do not have to exceed the internal bandwidths of such devices employing linear amplifiers. For digital (pulse) input signals, this greatly reduces the bandwidth requirements on the D/A converters (and other components) used in the devices, potentially lowering overall complexity as well as power consumption.

With QPWM using Cartesian coordinates in a modulator, phase information does not have to be introduced separately because it is already contained in the Cartesian form of signal. Thus, there is no time difference between phase and amplitude information. With QPWM described in this application, all information is contained in the amplitude domain; a quadrature signal is after all two amplitude-modulated signals that have phase positions such that they are orthogonal.

It will be appreciated that procedures described above are carried out repetitively as necessary, for example, to respond to the time-varying nature of communication channels between transmitters and receivers. In addition, in terms of the downlink and a UE, it will be understood that the methods and apparatus described here can be implemented in a BS or other uplink receiving node.

To facilitate understanding, many aspects of this invention are described in terms of sequences of actions that can be performed by, for example, elements of a programmable computer system. It will be recognized that various actions could be performed by specialized circuits (e.g., discrete logic gates interconnected to perform a specialized function or application-specific integrated circuits), by program instructions executed by one or more processors, or by a combination of both. Wireless receivers implementing embodiments of this invention can be included in, for example, mobile telephones, pagers, headsets, laptop computers and other mobile terminals, base stations, and the like.

Moreover, this invention can additionally be considered to be embodied entirely within any form of computer-readable storage medium having stored therein an appropriate set of instructions for use by or in connection with an instruction-execution system, apparatus, or device, such as a computer-based system, processor-containing system, or other system that can fetch instructions from a medium and execute the instructions. As used here, a "computer-readable medium" can be any means that can contain, store, communicate, propagate, or transport the program for use by or in connection with the instruction-execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium include an electrical connection having one or more wires, a portable computer diskette, a random-access memory (RAM), a read-only memory (ROM), an erasable programmable read-only memory (EPROM or Flash memory), and an optical fiber.

Thus, the invention may be embodied in many different forms, not all of which are described above, and all such forms are contemplated to be within the scope of the invention. For each of the various aspects of the invention, any such form may be referred to as "logic configured to" perform a described action, or alternatively as "logic that" performs a described action.

It is emphasized that the terms "comprises" and "comprising", when used in this application, specify the presence of stated features, integers, steps, or components and do not preclude the presence or addition of one or more other features, integers, steps, components, or groups thereof.

The particular embodiments described above are merely illustrative and should not be considered restrictive in any way. The scope of the invention is determined by the following claims, and all variations and equivalents that fall within the range of the claims are intended to be embraced therein.

What is claimed is:

1. A device for generating quadrature pulse-width modulation (QPWM) signals, comprising:
    a circuit configured to generate, based on an in-phase (I) component and a quadrature phase (Q) component of an input signal, at least two respective pulse-width modulated (PWM) signals that are trains of pulses; and
    a reshaper configured to transform the at least two PWM signals into a QPWM signal, wherein the QPWM signal is a succession of pulses, and alternating pulses have widths that correspond to one or the other of the I and Q components;
    wherein the circuit comprises a first pulse-width modulator configured to generate one of the PWM signals based on the I component and a second pulse-width modulator configured to generate another of the PWM signals based on the Q component, each of the first and second pulse-width modulators comprises a respective pair of controllable time-delay elements and a logic gate, each of the pairs of controllable time-delay elements phase-shift a reference signal in opposite temporal directions based on a respective one of the I and Q components, and each gate produces a respective one of the PWM signals based on the phase-shifted reference signal.

2. The device of claim 1, wherein at least one of the first and second pulse-width modulators includes a pair of comparators and an inverter.

3. The device of claim 1, wherein each of the first and second pulse-width modulators comprises a respective low-pass filter and a differential amplifier configured to combine a fed-back portion of the respective PWM signals and a respective one of the I and Q components.

4. The device of claim 3, further comprising at least one predistorter that produces at least one of the I and Q components on which respective PWM signals are based.

5. The device of claim 1, wherein the reshaper includes a logical OR gate that produces the QPWM signal based on signals from the logic gates.

6. The device of claim 1, wherein the I and Q components are differential signals, and the reference signal is a square wave.

7. The device of claim 1, wherein the I and Q components are differential signals, and the reference signal comprises first and second rectangular waves that have different duty cycles.

8. The device of claim 1, wherein the reshaper includes at least two logic gates that produce the QPWM signal based on signals from the at least two PWM signals.

9. A device for generating quadrature pulse-width modulation (QPWM) signals, comprising:
    a circuit configured to generate, based on an in-phase (I) component and a quadrature phase (Q) component of an input signal, at least two respective pulse-width modulated (PWM) signals that are trains of pulses; and
    a reshaper configured to transform the at least two PWM signals into a QPWM signal, wherein the QPWM signal is a succession of pulses, and alternating pulses have widths that correspond to one or the other of the I and Q components, and the reshaper includes two pairs of logic gates and a NAND gate for each pair that produce the QPWM signal based on signals from the pairs of logic gates.

10. A device for generating quadrature pulse-width modulation (QPWM) signals, comprising:
    a circuit configured to generate, based on an in-phase (I) component and a quadrature phase (Q) component of an input signal, at least two respective pulse-width modulated (PWM) signals that are trains of pulses;

a reshaper configured to transform the at least two PWM signals into a QPWM signal, wherein the QPWM signal is a succession of pulses, and alternating pulses have widths that correspond to one or the other of the I and Q components;

at least two amplifiers, wherein the QPWM signal comprises a pair of QPWM signals and each of the pair of QPWM signals is amplified by a respective amplifier, and a combiner configured to combine the amplified pair of QPWM signals.

11. The device of claim 10, further comprising a demodulator configured to produce feedback signals based on a combined signal produced by the combiner, wherein the PWM signals are based on combinations of the feedback signals and the I and Q components.

12. A method of generating quadrature pulse-width modulation (QPWM) signals, comprising the steps of:

converting, by a converting circuit, in-phase (I) and quadrature (Q) components of an input signal into at least two pulse-width modulated (PWM) signals that are trains of pulses, and reshaping, by a reshaping circuit, the at least two PWM signals into a QPWM signal, wherein the QPWM signal is a succession of pulses, and alternating pulses have widths that correspond to one or the other of the I and Q components, and the QPWM signal comprises a pair of signals;

separately amplifying each of the pair of signals; and combining the amplified pair of signals.

13. The method of claim 12, wherein the converting step comprises combining fed-back portions of the PWM signals and respective ones of the I and Q components to be converted.

14. The method of claim 13, wherein the converting step further comprises predistorting the I and Q components.

15. The method of claim 12, further comprising adding feedback signals based on the combined amplified pair of signals to respective ones of the I and Q components.

* * * * *

UNITED STATES PATENT AND TRADEMARK OFFICE
CERTIFICATE OF CORRECTION

PATENT NO. : 8,179,957 B2  
APPLICATION NO. : 12/135326  
DATED : May 15, 2012  
INVENTOR(S) : Bryant Page 1 of 1

It is certified that error appears in the above-identified patent and that said Letters Patent is hereby corrected as shown below:

In Fig. 3A, Sheet 2 of 10, delete " $\frac{T}{4}$ " and insert -- $\frac{T}{4}$ --, therefor.

In Column 4, Line 66, delete "1," and insert -- I, --, therefor.

Signed and Sealed this  
Thirteenth Day of November, 2012

David J. Kappos  
*Director of the United States Patent and Trademark Office*